United States Patent
Ohba

(10) Patent No.: US 7,420,410 B2
(45) Date of Patent: Sep. 2, 2008

(54) VARIABLE GAIN AMPLIFIER CIRCUIT, METHOD OF CORRECTING DC OFFSET OF THE VARIABLE GAIN AMPLIFYING CIRCUIT, AND RADIO RECEIVING APPARATUS

(75) Inventor: Hideo Ohba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 126 days.

(21) Appl. No.: 11/448,828

(22) Filed: Jun. 8, 2006

(65) Prior Publication Data

US 2006/0284671 A1 Dec. 21, 2006

(30) Foreign Application Priority Data

Jun. 15, 2005 (JP) ............... 2005-174571

(51) Int. Cl.
*H03F 1/02* (2006.01)
(52) U.S. Cl. .................. 330/9; 330/254; 330/253
(58) Field of Classification Search .............. 330/9, 330/254, 253
See application file for complete search history.

(56) References Cited

U.S. PATENT DOCUMENTS

| | | | |
|---|---|---|---|
| 6,441,684 B1 * | 8/2002 | Nakamura | 330/9 |
| 6,741,131 B2 * | 5/2004 | Nicklasson | 330/254 |
| 7,061,325 B2 * | 6/2006 | Pitz | 330/279 |
| 7,148,744 B2 * | 12/2006 | Bailey et al. | 330/9 |
| 7,239,199 B1 * | 7/2007 | Chien et al. | 330/9 |
| 2005/0200421 A1 * | 9/2005 | Bae et al. | 330/308 |

FOREIGN PATENT DOCUMENTS

JP 9-64666 A 3/1997

* cited by examiner

*Primary Examiner*—Patricia Nguyen
(74) *Attorney, Agent, or Firm*—Sughrue Mion, PLLC

(57) ABSTRACT

A variable gain amplifier circuit according to an embodiment of the invention includes: an output offset correcting unit for executing correction to attenuate a fixed offset component independent of a gain change of a variable gain amplifier circuit out of a DC offset involved in an output voltage of an amplifying unit; and an input offset correcting unit for executing correction to attenuate an input offset component that varies depending on a gain of an amplifying unit. The correction of the fixed offset component with the output offset correcting unit and the correction of the input offset component with the input offset correcting unit are independently executed.

27 Claims, 10 Drawing Sheets

VARIABLE GAIN AMPLIFIER CIRCUIT, METHOD OF CORRECTING DC OFFSET OF THE VARIABLE GAIN AMPLIFYING CIRCUIT, AND RADIO RECEIVING APPARATUS

BACKGROUND OF THE INVENTION

1. Field of the Invention

The present invention relates to a variable gain amplifier circuit. In particular, the invention relates to a variable gain amplifier circuit and a method of correcting a DC offset of the variable gain amplifier circuit for correcting a DC offset involved in an output signal of an amplifier circuit.

2. Description of Related Art

A differential amplifier circuit composed of MOS transistors has been known to have a DC offset in an output voltage due to a threshold voltage mismatch between MOS transistors as a differential pair which results from a variation in gate width between the MOS transistors, a mismatch between load resistors as components of the differential amplifier circuit, or the like.

A method of correcting a DC offset involved in the output voltage of such a differential amplifier circuit has been hitherto known. For example, Japanese Unexamined Patent Application Publication No. 9-64666 discloses a variable gain amplifier circuit including a differential amplifier circuit having a variable gain function and correcting a DC offset of an output voltage.

The variable gain amplifier circuit as disclosed in Japanese Unexamined Patent Application Publication No. 9-64666 is configured so as to switch between an offset detection mode and a signal amplifying mode, and an offset storage unit stores a DC offset amount detected in the offset detection mode. Here, the term "offset storage unit" means a capacitor for storing and outputting a DC offset amount as an analog value, and a memory for storing a digital value corresponding to a DC offset correction voltage output by a D/A converter (DAC). Further, in the signal amplifying mode, DC offset correction is executed such that a signal voltage from which an output voltage corresponding to a DC offset amount stored in an offset storage unit is subtracted is applied to a signal amplifying unit.

However, the DC offset amount varies depending on a gain of a signal amplifying unit. Hence, the conventional variable gain amplifier circuit as disclosed in Japanese Unexamined Patent Application Publication No. 9-64666 faces a problem in that a DC offset amount should be stored in the offset storage unit again at the time of changing the gain. Referring to FIG. 14, this problem is discussed.

FIG. 14 shows a configuration of the conventional variable gain amplifier circuit 8. An amplifying unit 81 is a differential amplifier circuit having a variable gain function. A gain switching unit 82 switches a gain of the amplifying unit 81 in accordance with a gain switching signal. Further, an input offset correction unit 83 is a circuit for subtracting an input offset correction voltage $V_{OC\_in}$ as described below from an input signal voltage of the amplifying unit 81 to prevent the DC offset.

The DC offset $V_{OS}$ includes a fixed offset component $V_{OS\_fix}$ that is fixed independently of a gain change due to a variation of a load resistor or current source of the amplifying unit 81 and an input offset component $V_{OS\_in}$ that depends on a variation on the input side such as a variation in threshold voltage of the differential pair and changes in proportion to a gain. That is, the voltage $V_{OS}$ can be represented by Expression (1) below as a function of a gain A of the amplifying unit 81.

$$V_{OS}(A) = V_{OS\_in} * A + V_{OS\_fix} \tag{1}$$

The variable gain amplifier circuit 8 executes DC offset correction by subtracting the input offset correction voltage $V_{OC\_in}$ from the input signal voltage of the amplifying unit 81 such that the voltage $V_{OS}$ derived from Expression (1) equals 0. That is, a correction voltage $V_{OC\_in}$ is determined to establish Expression (2) below:

$$V_{OS}(A) = (V_{OS\_in} - V_{OC\_in}) * A + V_{OS\_fix} = 0 \tag{2}$$

Based on Expression (2) above, the voltage $V_{OC\_in}$ that makes the voltage $V_{OS}$ zero can be represented by Expression (3) below. The correction voltage $V_{OC\_in}$ represented by Expression (3) is stored in the input offset correction unit 83, and the generation of the DC offset $V_{OS}$ can be suppressed by subtracting the calculated voltage $V_{OC\_in}$ from the input signal voltage of the amplifying unit 81.

$$V_{OC\_in} = V_{OS\_fix}/A + V_{OS\_in} \tag{3}$$

As is apparent from Expression (3), however, the input offset correction voltage $V_{OC\_in}$ depends on the gain A of the amplifying unit 81. Thus, at the time of changing the gain A, a value of the input offset correction voltage $V_{OC\_in}$ for correcting the offset should be changed. Accordingly, the conventional variable gain amplifier circuit 8 needs to store the correction voltage again in the input offset correction unit 83 at the time of changing the gain of the amplifying unit 81.

For example, if the input offset correction unit 83 stores the correction voltage $V_{OC\_in}$ in the capacitor, it is necessary to take enough time to charge the capacitor up to a voltage corresponding to the DC offset amount once again. In addition, if the input offset correction unit 83 is the DAC, it is necessary to enough time to determine a DC offset amount based on an output signal of the amplifying unit 81, enough time to control the DAC in accordance with the determined DC offset amount, or enough time to read a correction value previously recorded as a correction amount for each gain from a memory and set the value to the DAC once again.

As discussed above, the conventional variable gain amplifier circuit should execute DC offset correction each time a gain is changed, and time necessary for changing the gain is limited by offset correction time. This causes a problem in that the gain cannot be changed at high speeds.

For example, a receiver of a radio communication apparatus conforming to IEEE802.11a or other such wireless LAN standards needs to change a gain and adjusts a DC offset within a limited preamble period to amplify a reception signal after the preamble period. As a result, there is a possibility that if it takes much time to change a gain, a preparation for reception is not completed during the preamble period.

Incidentally, in some structures, a capacitor for cutting a DC component is inserted on the output side of the variable gain amplifier circuit to thereby cut DC components of an output voltage. In this case as well, it takes much time to converge a DC offset to zero while charging a capacitor. Thus, such structures are not appropriate for a variable gain amplifier circuit that needs to switch a gain at high speeds.

As mentioned above, the conventional variable gain amplifier circuit that needs to recorrect a DC offset each time a gain of the variable gain amplifier circuit is changed has a problem in that it takes much time to recorrect a DC offset and thus a gain cannot be changed at high speeds.

SUMMARY OF THE INVENTION

A variable gain amplifier circuit according to an aspect of the present invention includes: an amplifying unit capable of switching a gain; and a correction control unit that individually executes correction to attenuate a fixed offset component independent of a change in gain of the amplifying unit out of a DC offset involved in an output voltage of the amplifying unit and correction to attenuate an input offset component proportional to the gain of the amplifying unit.

With such configuration, the correction of the fixed offset component independent of the gain of the variable gain amplifier circuit and the correction of the input offset component that varies depending on the gain can be independently executed. Through this offset correction, the correction voltage for the fixed offset component and the correction voltage for the input offset component become independent of a gain. Thus, the DC offset can be continually cancelled even if the offset correction is not executed again at the time of changing a gain of the variable gain amplifier circuit. Consequently, the variable gain amplifier circuit according to the present invention does not need to execute an offset cancel operation again at the time of switching a gain, so a gain control speed is not limited by the offset cancel operation and a gain can be switched at high speeds.

Further, according to another aspect of the present invention, a DC offset correcting method for attenuating a DC offset involved in an output voltage of a differential amplifier circuit capable of switching a gain includes: executing correction to attenuate a fixed offset component independent of a change in gain of the differential amplifier circuit out of the DC offset; and executing correction to attenuate an input offset component that varies depending on the gain of the differential amplifier circuit.

With the DC offset correcting method, the correction voltage for the fixed offset component and the correction voltage for the input offset component become independent of a gain. Thus, the DC offset can be continually cancelled even if the offset correction is not executed again at the time of changing a gain of the variable gain amplifier circuit. Consequently, the variable gain amplifier circuit that does not need to recorrect a DC offset at the time of changing a gain can be realized by implementing DC offset correction of the present invention.

According to the present invention, it is possible to provide a variable gain amplifier circuit that does not need to recorrect a DC offset at the time of changing a gain.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A variable gain amplifier circuit according to a first embodiment mode of the present invention includes: an amplifying unit capable of switching a gain; and a correction control unit that executes correction to attenuate a DC offset involved in an output voltage of the amplifying unit. Here, the correction control unit individually executes correction to attenuate a fixed offset component independent of a change in gain of the amplifying unit out of the DC offset involved in the output voltage of the amplifying unit and correction to attenuate an input offset component proportional to the gain of the amplifying unit.

Further, in the variable gain amplifier circuit according to the first embodiment mode, the correction control unit preferably corrects the input offset component after correcting the fixed offset component.

More specifically, the fixed offset component may be corrected while setting the gain of the amplifying unit such that the input offset component is not involved in the output voltage of the amplifying unit.

Incidentally, in the following first embodiment of the present invention, an input offset correcting unit 13 and an output offset correcting unit 14 correspond to the correction control unit of the variable gain amplifier circuit according to the first embodiment mode.

Hereinafter, embodiments of the present invention are described in detail with reference to the accompanying drawings.

First Embodiment

Figure 1:
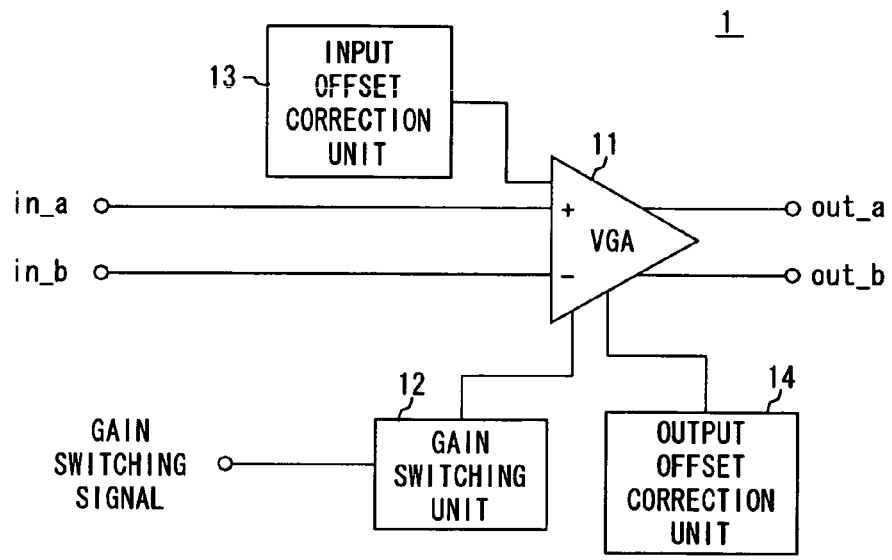
FIG. 1 is a diagram of a variable gain amplifier circuit according to a first embodiment of the present invention.

FIG. 1 shows the configuration of a variable gain amplifier circuit 1 according to a first embodiment of the present invention. Here, an amplifying unit 11 is a differential amplifier circuit capable of switching a gain. A gain switching unit 12 switches a gain of the amplifying unit 11 in accordance with a gain switching signal. Further, the input offset correcting unit 13 is a circuit for subtracting the following input offset correction voltage $V_{OC\_in}$ from an input signal of the amplifying unit 11 to prevent a DC offset. Further, the output offset correcting unit 14 is a circuit for subtracting an output offset correction voltage $V_{OC\_out}$ from output signal of the amplifying unit 11 to prevent a DC offset.

Figure 2:
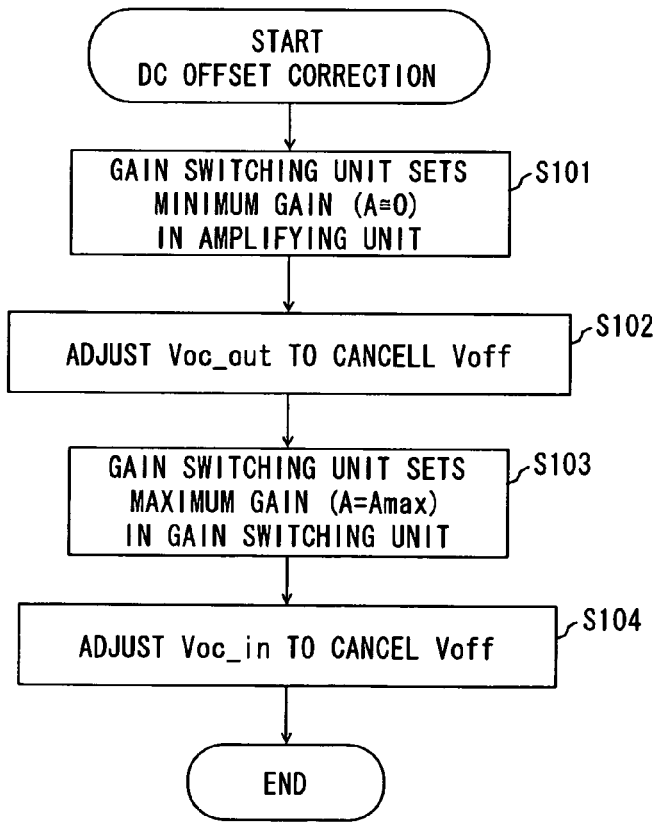
FIG. 2 is a flowchart of a DC offset correcting method according to the first embodiment of the present invention.

Referring to a flowchart of FIG. 2, an offset correction procedure of a variable gain amplifier circuit 1 is explained.

First, a gain switching unit 12 sets a gain of the amplifying unit 11 to the minimum gain (A≅0) (step S101). At this time, the DC offset $V_{OS}$ can be derived from Expression (4) based on Expression (1) above.

$$V_{OS}(0)=V_{OS\_fix} \quad (4)$$

That is, a fixed component $V_{OS\_fix}$ independent of a gain appears as the DC offset. Accordingly, the output offset correction voltage $V_{OC\_out}$ is adjusted to prevent a DC offset, ideally, to reduce the DC offset to zero with the minimum gain (A≅0) to thereby cancel the fixed component $V_{OS\_fix}$ of the DC offset. More specifically, based on Expression (5), the adjusted voltage $V_{OC\_out}$ can be derived from Expression (6).

$$V_{OS}(0)=V_{OS\_fix}-V_{OC\_out}=0 \quad (5)$$

$$V_{OC\_out}=V_{OS\_fix} \quad (6)$$

In a step S103, the gain switching unit 12 sets the gain of the amplifying unit 11 to the maximum gain. Since the fixed component of the DC offset has been canceled through the adjustment of the voltage $V_{OC\_out}$ in step S102 and in this case, the DC offset can be derived from Expression (7) below.

$$V_{OS}(A_{max})=V_{OS\_in}*A_{max} \quad (7)$$

where $A_{max}$ represents the maximum gain.

In step S104, the input offset correction voltage $V_{OC\_in}$ is adjusted to prevent the DC offset $V_{OS}(A_{max})$, ideally, to reduce the DC offset to zero based on Expression (7). More specifically, based on Expression (8), the adjusted voltage $V_{OC\_in}$ can be derived from Expression (9).

$$V_{OS}(A_{max})=(V_{OS\_in}-V_{OC\_in})\times A_{max}=0 \quad (8)$$

$$V_{OC\_in}=V_{OS\_in} \quad (9)$$

In this way, in the variable gain amplifier circuit 1 of the present invention, correction is executed in two stages: output offset correction for canceling the fixed component of the DC offset $V_{OS\_fix}$ and input offset correction for canceling a component $V_{OS\_in}$ that depends on a gain of the amplifying unit 11, by which the DC offset $V_{OS}$ can be corrected.

The aforementioned conventional variable gain amplifier circuit 8 correctively cancels the DC offset including the input offset component and the fixed offset component through the input offset correction. This causes a problem in that the offset correction should be performed each time a gain is changed.

In contrast, a feature of the variable gain amplifier circuit 1 and the DC offset correcting method of present invention is that correction is executed in two stages: output offset correction for canceling the fixed offset component independent of the gain and input offset correction for canceling the input offset component that varies depending on the gain. This is advantageous in that the output offset correction voltage $V_{OC\_out}$ derived from Expression (6) and the input offset correction voltage $V_{OC\_in}$ derived from Expression (9) are both independent of the gain A of the amplifying unit 11.

Thus, the variable gain amplifier circuit 1 of the present invention can suppress the DC offset without readjusting the components $V_{OC\_out}$ and $V_{OC\_in}$ even when the gain A of the amplifying unit 11 is changed. Therefore, the variable gain amplifier circuit 1 of the present invention can switch a gain at higher speed than the conventional variable gain amplifier circuit 8 that needs to execute offset correction each time the gain is changed. The above offset correction may be executed during a period in which a signal amplifying operation is not executed, for example, at power-on of the variable gain amplifier circuit 1 or during standby.

Incidentally, in steps S103 and S104, correction is executed while setting the gain of the amplifying unit 11 at the maximum gain, but the gain may not be the maximum gain. However, if the offset correction is executed with a larger gain of the amplifying unit 11, there are advantages in that the DC offset $V_{OS}$ is largely changed due to the change in input offset correction voltage $V_{OC\_in}$, which facilitates the adjustment of the component $V_{OC\_in}$, and that an amount of residual DC offset in an output voltage after the offset correction can be reduced. Thus, the input offset correction in step S104 is desirably executed while setting the gain of the amplifying unit 11 at the maximum gain.

Figure 3:
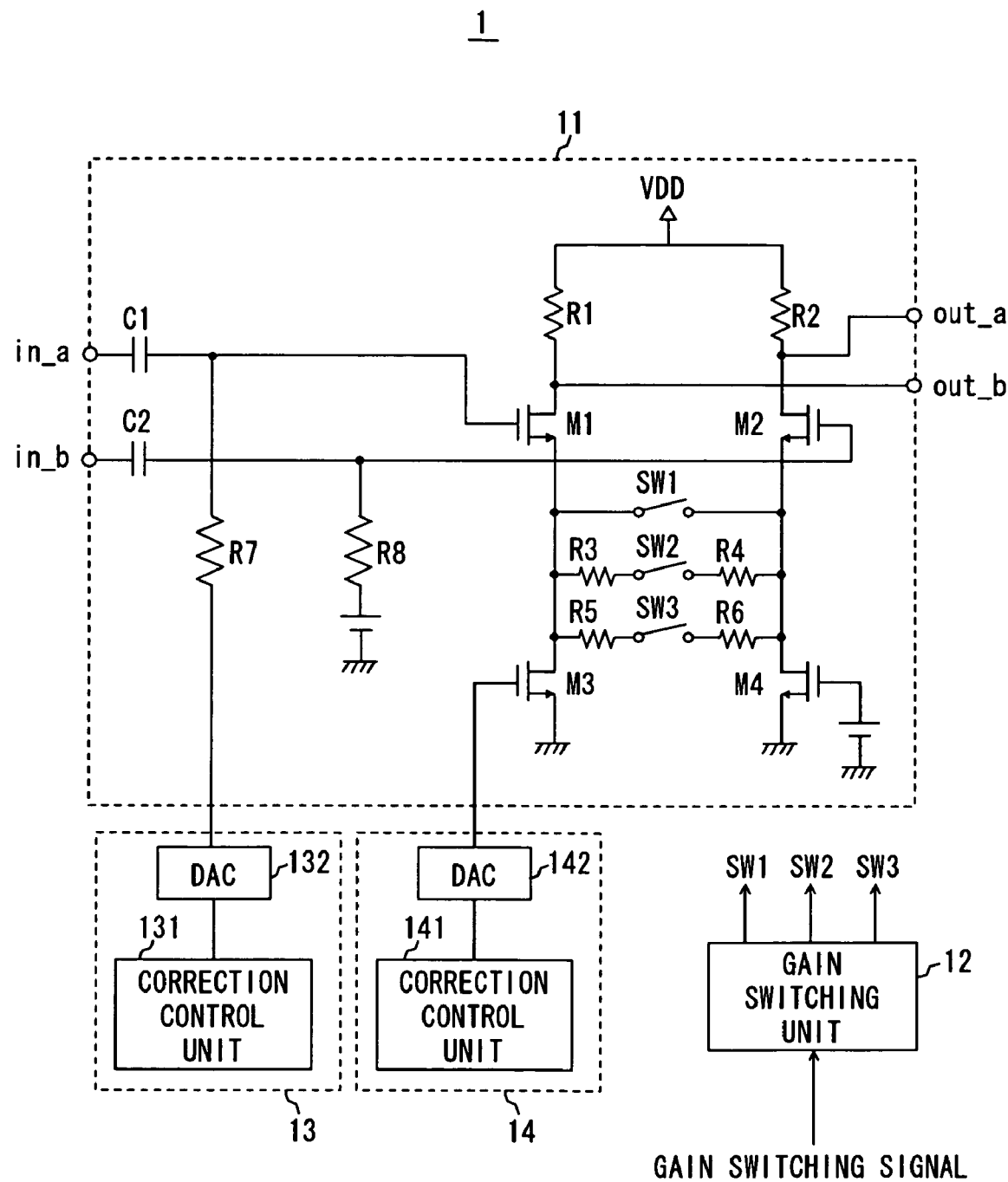
FIG. 3 is a diagram of a variable gain amplifier circuit according to the first embodiment of the present invention.

FIG. 3 shows a specific example of the configuration of the variable gain amplifier circuit 1 of this embodiment. The amplifying unit 11 includes a differential pair of NMOS transistors M1 and M2. A gain switching unit 12 sends an ON/OFF control signal to switches SW1 to SW3 of the amplifying unit 11. In the illustrated example of FIG. 3, two levels of gain, gain A1 and gain A2, can be switched from each other by means of the switches SW2 and SW3. Incidentally, the switch SW1 is used for obtaining the maximum gain set in steps S103 and S104 of FIG. 2. More specifically, at the time of setting the minimum gain in step S101, SW1=OFF, SW2=OFF, and SW3=OFF. At the time of setting the maximum gain in step S103, SW1=ON, SW2=OFF, and SW3=OFF. Further, at the time of setting the gain A1=R1/(R3+1/gm), SW1=OFF, SW2=ON, and SW3=OFF. At the time of setting the gain A2=R1/(R5+1/gm), SW1=OFF, SW2=OFF, and SW3=ON. Here, R1=R2, R3=R4, and R5=R6, and gm represents a mutual conductance of the transistors M1 and M2.

An output offset correcting unit 14 includes a correction control unit 141 for controlling the above output offset correction and a D/A converter (DAC) 142. An output signal of the DAC 142 is input to a gate of the transistor M3. The transistor M3 is connected with a source of the transistor M1 as the differential pair. By adjusting the output signal of the DAC 142, a drain current IDS flowing between a drain and a source of the transistor M1 can be adjusted to adjust the output voltage of an output terminal out_b. That is, the transistor M3 functions as a variable current source. The above output offset correction is executed by adjusting the output signal of the DAC 142. If a potential difference between the output terminals out_a and out_b of the differential pair is a predetermined value or smaller, the output signal of the DAC 142 is held and applied to the gate of the transistor M3.

Further, the input offset correcting unit 13 includes a correction control unit 131 for correcting the input offset after the output offset correction with the output offset correcting unit 14, and a D/A converter (DAC) 132. An output signal of the DAC 132 is input to a gate of the transistor M1 as the differential pair. The above input offset correction is executed by changing the output signal of the DAC 132, and if the DC offset becomes a predetermined value or less, the output signal of the DAC 132 is held and applied to the gate of the transistor M1.

Figure 4:
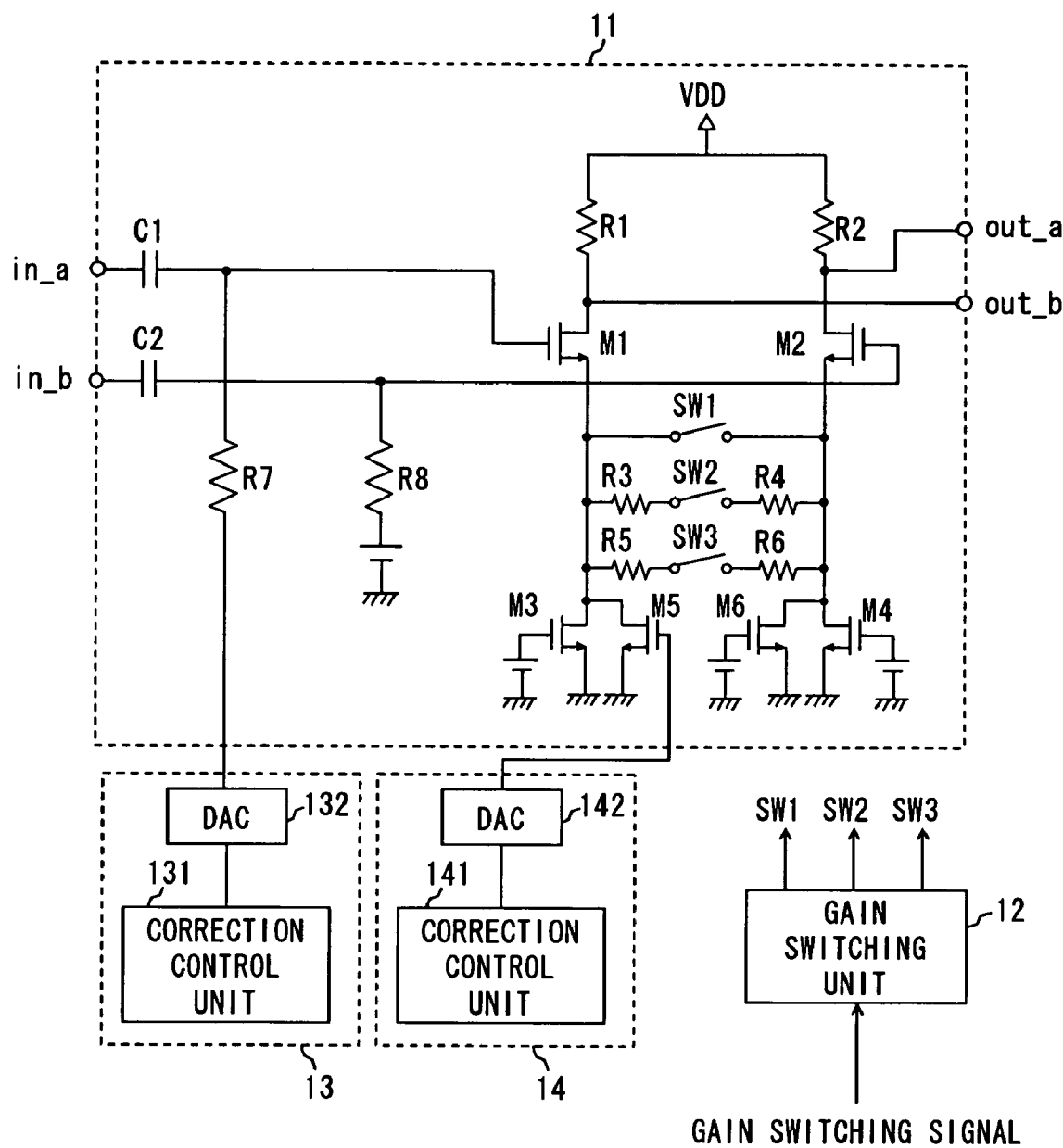
FIG. 4 is a diagram of a variable gain amplifier circuit according to the first embodiment of the present invention.

FIG. 4 shows another configuration example of the variable gain amplifier circuit 1. In the configuration illustrated in FIG. 4, transistors M5 and M6 are inserted in parallel to the transistors M3 and M4 of FIG. 3. Here, the gate widths of the transistors M5 and M6 are set smaller than the gate widths of the transistors M3 and M4, and a voltage is applied to one or both of the gate of the transistor M5 and the gate of the transistor M6. For example, provided that a gate width ratio of the transistor M3 to the transistor M5 is n:1, the drain current can be adjusted based on the gate voltage of the transistor M5 with such a voltage adjustment range which is n times wider than a voltage range of the adjustment by the transistor M3. If n=5, the drain current can be corrected with the voltage adjustment range of ±50 mV; this range is ±10 mV in the case of the transistor M3. That is, a variation in drain current can be minimized with respect to a variation in gate voltage, so the drain current of the transistor M1 can be more finely controlled and a correction error of the DC offset can be minimized.

Incidentally, in FIG. 4, the drain terminal of the transistor M5 may be connected to the output side node of resistor R1 which, in other words, is the common node between the resistor R1 and the transistor M1. Also in such configuration, the output voltage of the output terminal out_b can be adjusted by adjusting the output signal of the DAC 142.

In the above embodiments, the correction for attenuating the output offset component $V_{OS\_fix}$ is executed while setting the gain of the amplifying unit 11 at the minimum gain (A≅0), after which the gain of the amplifying unit 11 is switched to another, desirably, to the maximum gain, and the correction for attenuating the input offset component $V_{OS\_in}$ is executed. However, instead of setting the gain of the amplifying unit 11 at the minimum gain (A≅0), output offsets $V_{OS}$(A1) and $V_{OS}$(A2) corresponding to two given levels of gain, gain A1 and gain A2 may be calculated to derive the components $V_{OS\_fix}$ and $V_{OS\_in}$ from Expressions (10) and (11) below.

$$V_{OS}(A1) = V_{OS\_in} * A1 + V_{OS\_fix} \quad (10)$$

$$V_{OS}(A2) = V_{OS\_in} * A2 + V_{OS\_fix} \quad (11)$$

Second Embodiment

Figure 5:
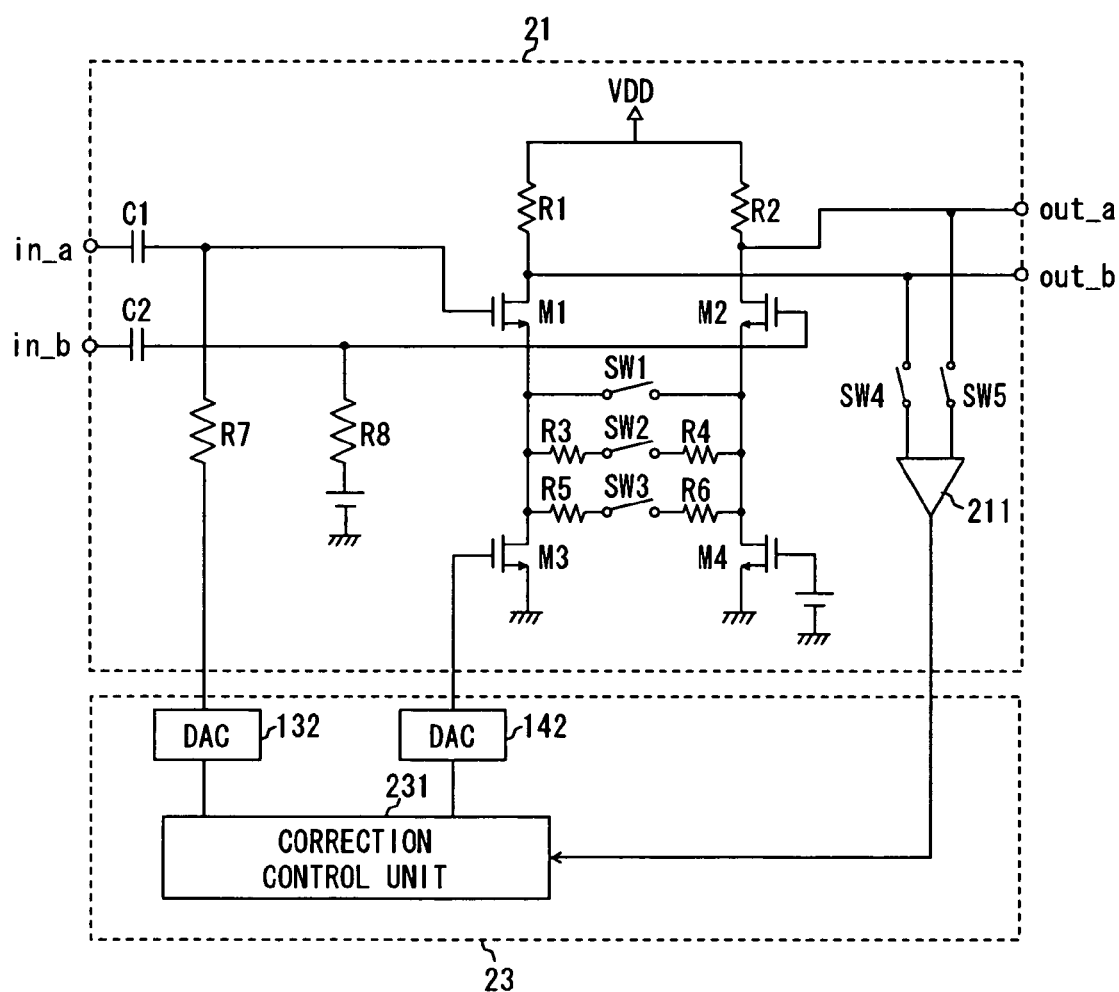
FIG. 5 is a diagram of a variable gain amplifier circuit according to a second embodiment of the present invention.

FIG. 5 shows the configuration of a variable gain amplifier circuit 2 according to a second embodiment of the present invention. The variable gain amplifier circuit 2 automates the offset correction as illustrated in the flowchart of FIG. 2. In the variable gain amplifier circuit 2, a comparator 211 determines a potential difference between the output terminals out_a and out_b of the amplifying unit 21. The output of the comparator 211 is input to the correction control unit 231 of the offset correction unit 23.

The offset correction unit 23 includes a correction control unit 231, and DACs 132 and 142. The correction control unit 231 adjusts output signals of the DACs 132 and 142 based on a result of comparing output voltage levels by the comparator 211 to thereby execute the above output offset correction and input offset correction. Incidentally, the other components are the same as those of the above variable gain amplifier circuit 1 and thus denoted by identical reference numerals, and their description is omitted here.

Figure 6:
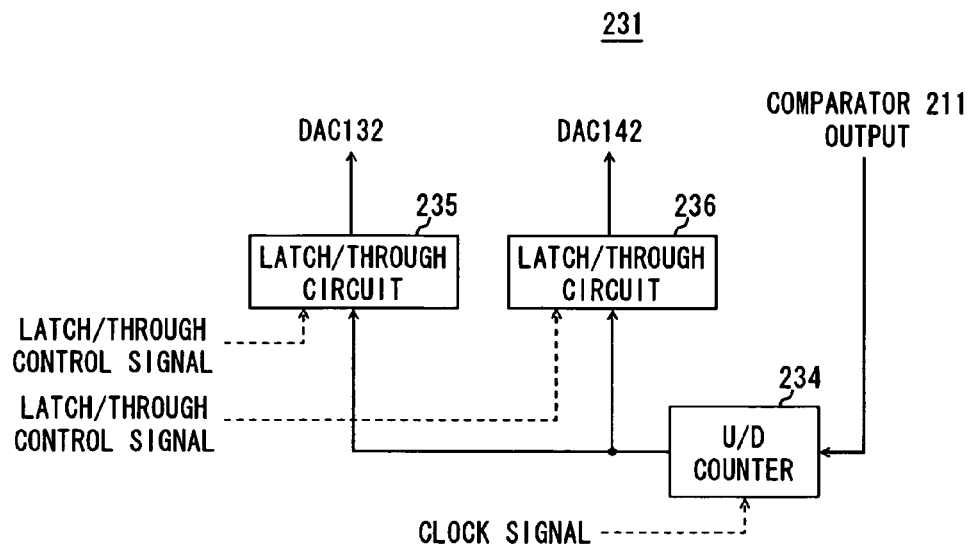
FIG. 6 is a diagram of a correction control unit.

Referring next to the detailed configuration of the correction control unit 231 of FIG. 6, an offset correction procedure of the variable gain amplifier circuit 2 is explained. A U/D counter 234 in the correction control unit 231 is a counter that is incremented/decremented based on the output of the comparator 211 on the rising edge or falling edge of a clock signal. Latch/through circuits 235 and 236 can switch between a through mode for outputting an input signal as it is and a latch mode for storing an input signal in accordance with a latch/through control signal.

Upon the output offset correction, the switches SW1 to SW3 are turned OFF to set the gain of the amplifying unit 21 to the minimum gain and the mode of the latch/through circuit 236 to the through mode. As the output of the comparator 211 indicates, if the DC offset is a negative value, the U/D counter 234 is incremented; otherwise, the counter is decremented. A count value of the U/D counter 234 is passed through the latch/through circuit 236 and input to the DAC 142. The DAC 142 controls its output toward a positive value if the DC offset is a negative value and controls its output toward a negative value if the DC offset is a negative value in accordance with the count value of the U/D counter 234. The above operation is repeated until the DC offset converges to a predetermined value or less. At the time when the DC offset converges to the predetermined value or less, the mode of the latch/through circuit 236 is changed to the latch mode, and a count value of the U/D counter 234 is stored in the latch/through circuit 236 as an output-offset-corrected value.

Next, in the case of correcting an input offset, the switch SW1 is turned ON to set the gain of the amplifying unit 21 to the maximum gain, and the mode of the latch/through circuit 235 to the through mode. At this time, the latch/through circuit 236 is kept in the latch mode. Similar to the output offset correction, if the DC offset indicated by the output of the comparator 211 is a negative value, the U/D counter 234 is incremented; otherwise, the counter is decremented. The count value of the U/D counter 234 is passed through the latch/through circuit 235 and input to the DAC 132. The DAC 132 controls its output toward a positive value if the DC offset is a negative value and controls its output toward a negative value if the DC offset is a positive value in accordance with the count value of the U/D counter 234. The above operation is repeated until the DC offset converges to a predetermined value or less. At the time when the DC offset converges to the predetermined value or less, the mode of the latch/through circuit 236 is changed to the latch mode, and a count value of the U/D counter 234 is stored in the latch/through circuit 235 as an input-offset-corrected value.

Figure 7:
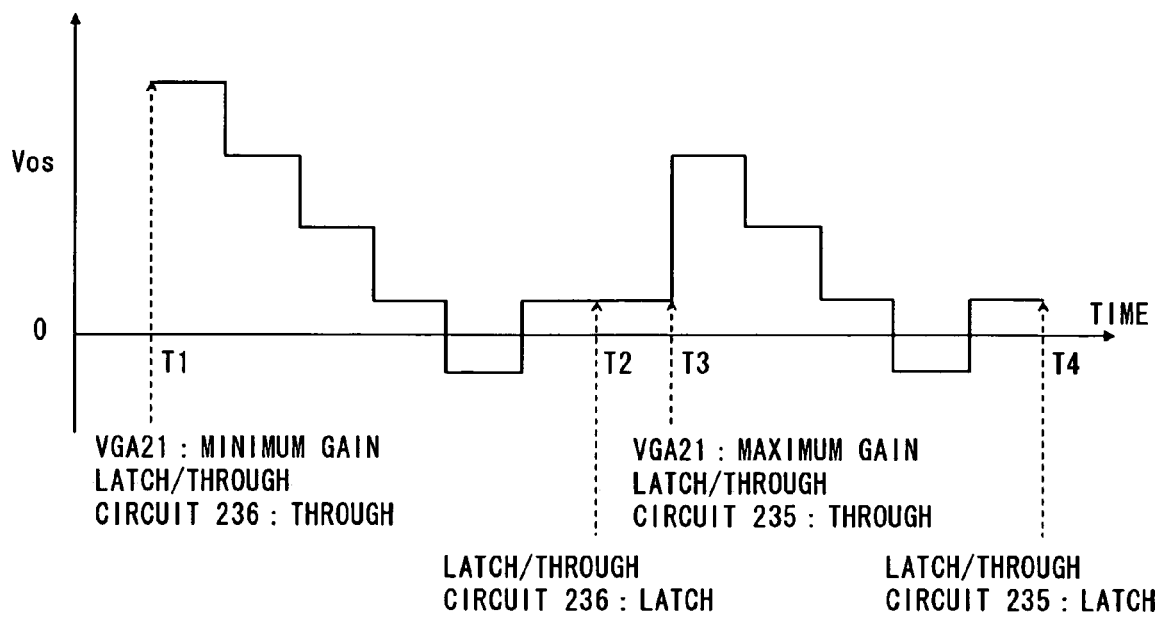
FIG. 7 shows how a DC offset is converged.

FIG. 7 shows how the DC offset $V_{OS}$ converges through the above offset correction. At time T1, the gain of the amplifying unit 21 is set to the minimum gain, and a mode of the latch/through circuit 236 is set to a through mode to start the output offset correction. In the illustrated example of FIG. 7, at time T1, the DC offset $V_{OS}$ is a positive value. Thus, as the U/D counter 234 decrements, the offset $V_{OS}$ is reduced. At time T2, it is determined that the offset $V_{OS}$ converges through the output offset correction, and the mode of the latch/through circuit 236 is changed to a latch mode. At a subsequent time, time T3, the gain of the amplifying unit 21 is set to the maximum gain, and the mode of the latch/through circuit 235 is set to the through mode to start the input offset correction. At time T4, it is determined that the offset $V_{OS}$ converges, and the mode of the latch/through circuit 235 is changed to the latch mode.

Through the above procedure, the DC offset correction is executed, and values stored in the latch/through circuits 235 and 236 are used for outputting the signals of the DACs 132 and 142. Thus, the recorrection of the DC offset at the time of changing the amplifying unit 21 is unnecessary.

Third Embodiment

Figure 8:
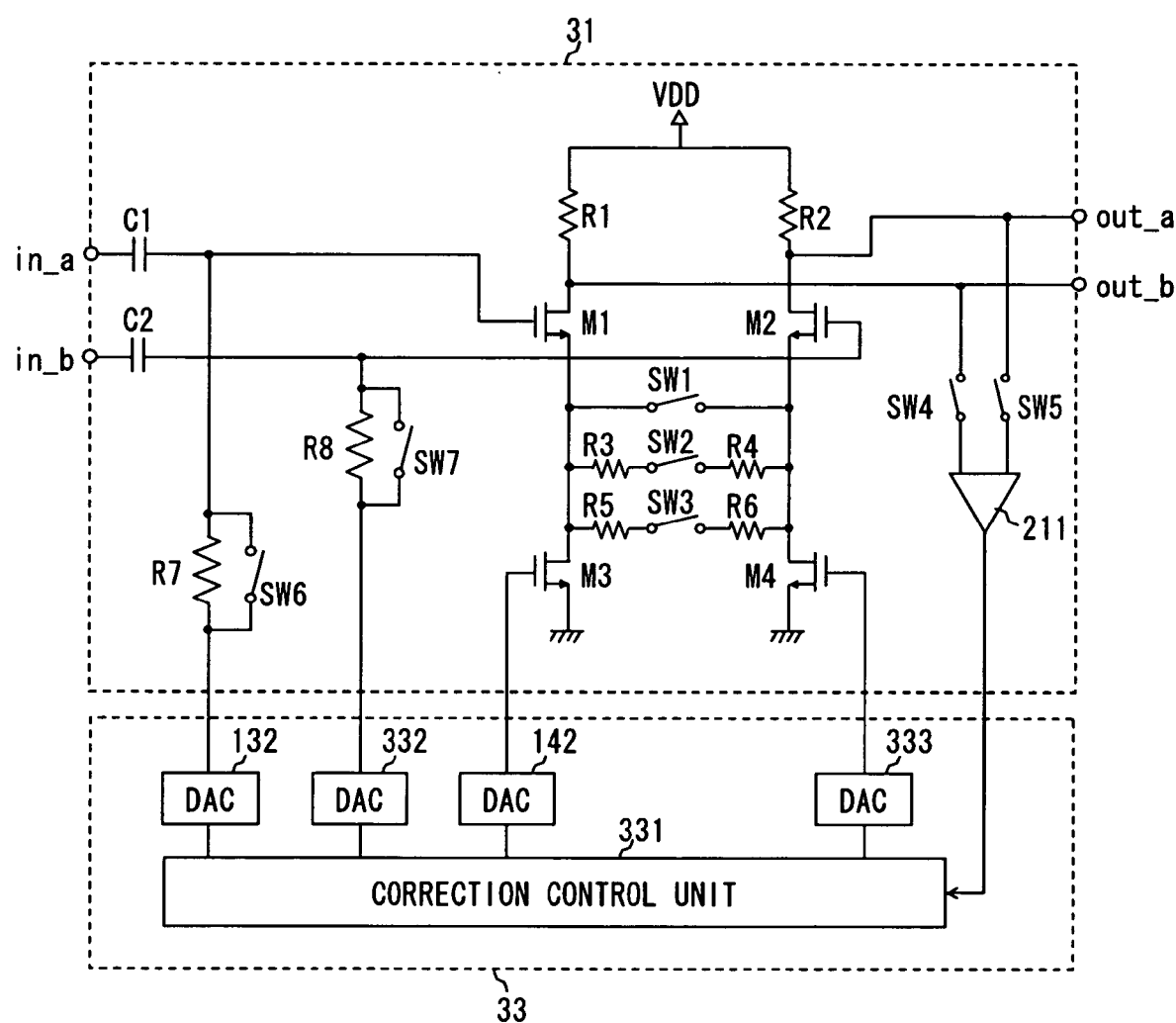
FIG. 8 is a diagram variable gain amplifier circuit according to a third embodiment of the present invention.

A variable gain amplifier circuit 3 according to a third embodiment of the present invention is an advanced on of the variable gain amplifier circuit 2 of the second embodiment, and enables higher-precision DC offset correction. FIG. 8 shows the configuration of the variable gain amplifier circuit 3. The variable gain amplifier circuit 3 includes a fine-adjust DAC 332 connected to an input line of an amplifying unit 31 other than the input line to which the DAC 132 is connected. The variable gain amplifier circuit 3 further includes a fine-adjust DAC 333 connected to the gate of the transistor M4.

Figure 9:
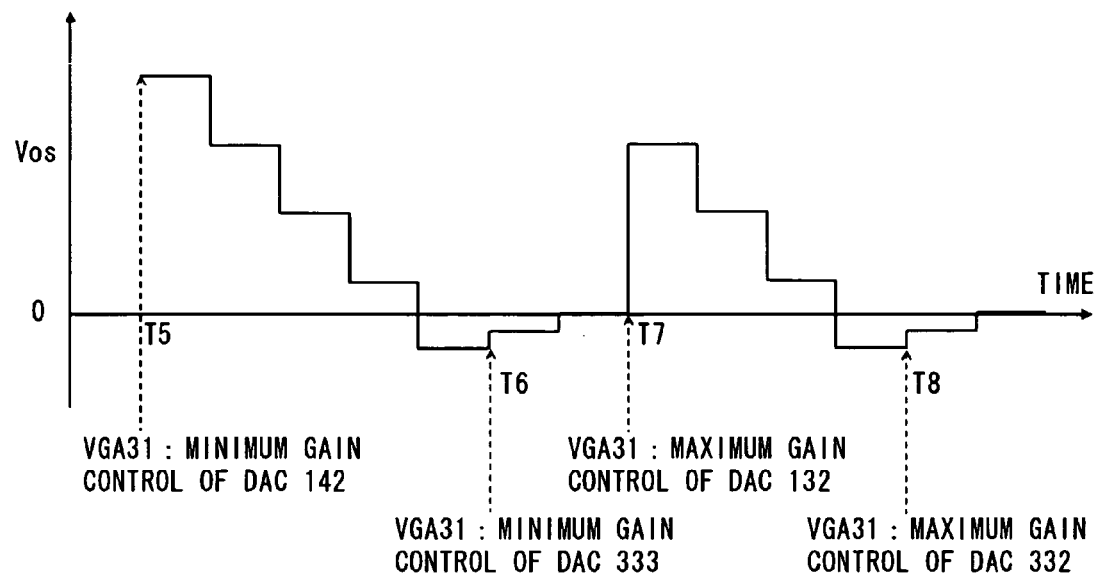
FIG. 9 shows how a DC offset is converged.

FIG. 9 shows how the DC offset $V_{OS}$ is converged at the time of correcting the offset of the variable gain amplifier circuit 3. First, similar to the variable gain amplifier circuit 2, the DAC 142 corrects the output offset to roughly converge the DC offset $V_{OS}$. After that, the fine-adjust DAC 333 to further converge the offset component $V_{OS}$ toward zero. As for the input offset correction as well, the DAC 132 roughly converges the offset component $V_{OS}$, and then the DAC 332 executes fine adjustment.

Such fine adjustment can be executed by increasing the number of bits of the DACs 132 and 142 in the variable gain amplifier circuit 2 of the second embodiment. However, increasing the number of bits of the DAC leads to a problem in that the circuit is scaled up and another problem in that it takes much time to converge the offset component $V_{OS}$. In contract, the circuit for each DAC can be downsized by independently providing a rough-adjustable DAC and a fine-adjust DAC. Further, the rough-adjustable DAC converges the offset component $V_{OS}$ in short time, and then the fine-adjust DAC executes fine adjustment, whereby the offset component $V_{OS}$ can be converged in a shorter time. For example, in place of the offset correction with an 8-bit DAC, a 6-bit DAC and a 2-bit DAC may be used for offset correction.

Further, the variable gain amplifier circuit 3 includes switches SW6 and SW7 parallel-connected with the resistors R7 and R8. The variable gain amplifier circuit 3 corrects the input offset component $V_{OS\_in}$ by switching output signals of the DACs 132 and 332. However, if "R7*C1" and "R8*C2" are large, it takes longer time for the transient phenomenon to settle down and stabilize after the adjustment of the DACs 132 and 332. Thus, at the time of correcting the input offset, the switches SW6 and SW7 are turned ON to pass signals around the resistors R7 and R8 and accelerate the stabilization of the transient phenomenon, thereby shortening time necessary for correcting the input offset.

Fourth Embodiment

Figure 10:
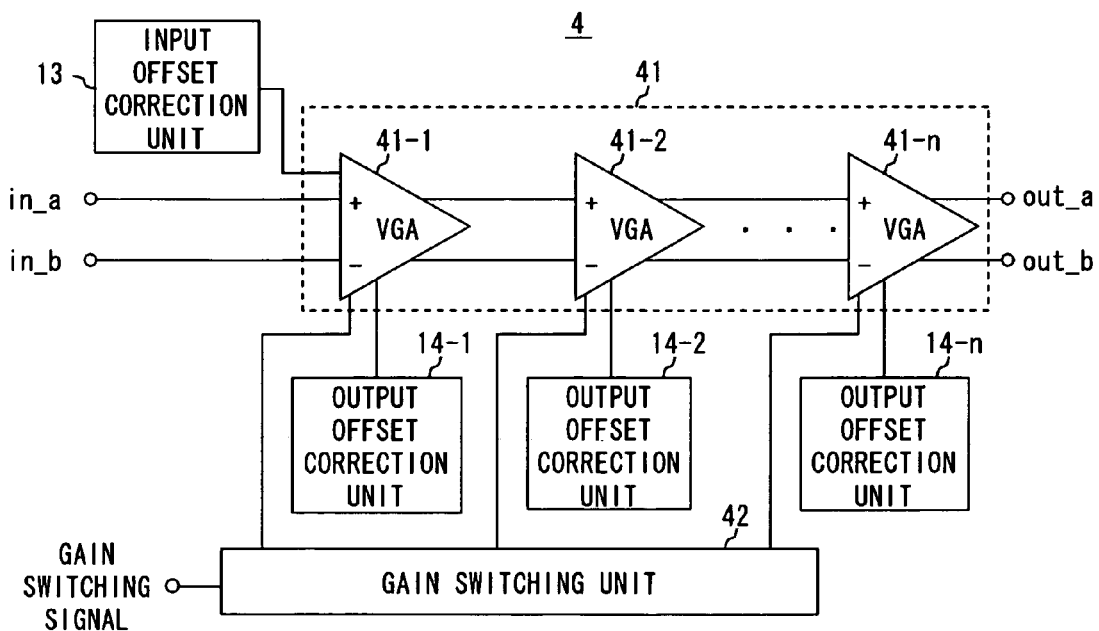
FIG. 10 is a diagram of the variable gain amplifier circuit according to the third embodiment of the present invention.

A fourth embodiment of the present invention is a multistage amplification type variable gain amplifier circuit. FIG. 10 shows the configuration of a variable gain amplifier circuit 4 of this embodiment. A multistage amplifying unit 41 includes n variable gain amplifying units 41-1 to 41-$n$. A gain switching unit 42 switches gains of the amplifying units 41-1 to 41-$n$, and output offset correcting units 14-1 to 41-$n$ correct offsets of the amplifying units 41-1 to 41-$n$. The input offset correcting unit 13 corrects an input offset of the first amplifying unit 41-1. Here, the reason why all the input offset correcting units 13 but a first one are unnecessary is that input offset correction of a kth unit (k is an arbitrary number other than 1) can be executed together with the output offset correction of a (k-1)th unit.

The DC offset of the nth amplifying unit 41-$n$ of the multistage amplifying unit 41 appears inclusive of the DC offsets of the first to (n-1)th amplifying units. The DC offset $V_{OS}^{(n)}$ of the amplifying unit 41-$n$ is derived from Expression (11).

$$V_{OS}^{(n)}=(V_{OS\_in}^{(1)}-V_{OC\_in}^{(1)})*A^{(1)}A^{(2)}\ldots A^{(n)}+ \\ (V_{OS\_in}^{(2)}+V_{OS\_fix}^{(1)}-V_{OC\_out}^{(1)})*A^{(2)}A^{(3)}\ldots \\ A^{(n)}+\ldots+(V_{OS\_in}^{(n-1)}+V_{OS\_fix}^{(n-2)}- \\ V_{OC\_out}^{(n-2)})*A^{(n-1)}A^{(n)}+(V_{OS\_in}^{(n)}+V_{OS\_fix}^{(n-1)}- \\ V_{OC\_out}^{(n-1)})*A^{(n)}+V_{OS\_fix}^{(n)}-V_{OC\_out} \quad (11)$$

Here, $V_{OS\_in}^{(k)}$ represents an input offset component proportional to a gain $A^{(k)}$ of a kth amplifying unit 41-$k$, and $V_{OS\_fix}^{(k)}$ represents a fixed offset component of the kth amplifying unit 41-$k$.

The DC offset correction of the variable gain amplifier circuit 4 can be executed in accordance with the following procedure. First, the gain switching unit 12-$n$ sets a gain $A^{(n)}$ of the nth unit as the final stage to the minimum gain ($A^{(n)} \cong 0$).

In this case, the offset component $V_{OS}^{(n)}$ is represented as follows.

$$V_{OS}^{(n)}=V_{OS\_fix}^{(n)}-V_{OC\_out}^{(n)} \quad (12)$$

Hence, the output offset correcting unit 14-$n$ is adjusted to reduce the offset component $V_{OS}^{(n)}$ derived from Expression (12) to zero, making it possible to cancel the fixed offset component $V_{OS\_fix}^{(n)}$ of the nth unit. At this time, the output offset correction voltage $V_{OC\_out}^{(n)}$ of the nth unit is represented as below.

$$V_{OC\_out}^{(n)}=V_{OS\_fix}^{(n)} \quad (13)$$

Next, a gain $A^{(n)}$ of the nth unit is set to the maximum gain, and a gain $A^{(n-1)}$ of the (n-1)th unit is set to the minimum gain ($A^{(n-1)} \cong 0$). In this case, since the fixed offset component $V_{OS\_fix}^{(n)}$ of the nth unit has been canceled, the offset component $V_{OS}^{(n)}$ can be derived from Expression (14) below.

$$V_{OS}^{(n)}=(V_{OS\_fix}^{(n-1)}+V_{OS\_in}^{(n)}-V_{OC\_out}^{(n-1)})*A^{(n)} \quad (14)$$

Thus, the output offset correcting unit 14-($n$-1) is adjusted to reduce the offset component $V_{OS}^{(n)}$ derived from Expression (14) to zero, making it possible to correctively cancel fixed offset component $V_{OS\_fix}^{(n-1)}$ of the (n-1)th unit and the input offset component $V_{OS\_in}^{(n)}$ of the nth unit. In this case, the output offset correction voltage $V_{OC\_out}^{(n-1)}$ of the (n-1)th unit is represented as below.

$$V_{OC\_out}^{(n-1)}=V_{OS\_fix}^{(n-1)}+V_{OS\_in}^{(n)} \quad (15)$$

The above procedure is repeated for up to the first amplifying unit 41-1, whereby the fixed offset component and the input offset component of each amplifying unit can be attenuated. Finally, the gain of the first amplifying unit 41-1 is set to the maximum gain, and the input offset correcting unit 13 cancels the input offset component $V_{OS\_in}^{(1)}$ of the first amplifying unit 41-1 so as to reduce the offset component $V^{os(n)}$ derived from Expression (16) to zero to thereby correct a DC offset involved in an output voltage of the multistage amplifying unit 41.

$$V_{OS}^{(n)}=(V_{OS\_in}^{(1)}-V_{OC\_in}^{(1)})*A^{(1)}A^{(2)}\ldots A^{(n)} \quad (16)$$

In this case, the input offset correction voltage $V_{OC\_in}^{(1)}$ of the first unit is calculated as below.

$$V_{OC\_in}^{(1)}=V_{OS\_in}^{(1)} \quad (17)$$

By executing such a correction procedure, the DC offset correction of the variable gain amplifier circuit 4 including the multistage amplifying unit 41 having plural amplifying units connected in series can be carried out. Further, as apparent from Expressions (13), (15), and (17), the output offset correction voltages and the input offset correction voltages for individual the amplifying units 41-1 to 41-$n$ are independent of gains of the amplifying units 41-1 to 41-$n$. Thus, even if the gain of the multistage amplifying unit 41 is changed, the recorrection of the DC offset is unnecessary, and the gain of the multistage amplifying unit 41 can be switched at high speeds.

Figure 11:
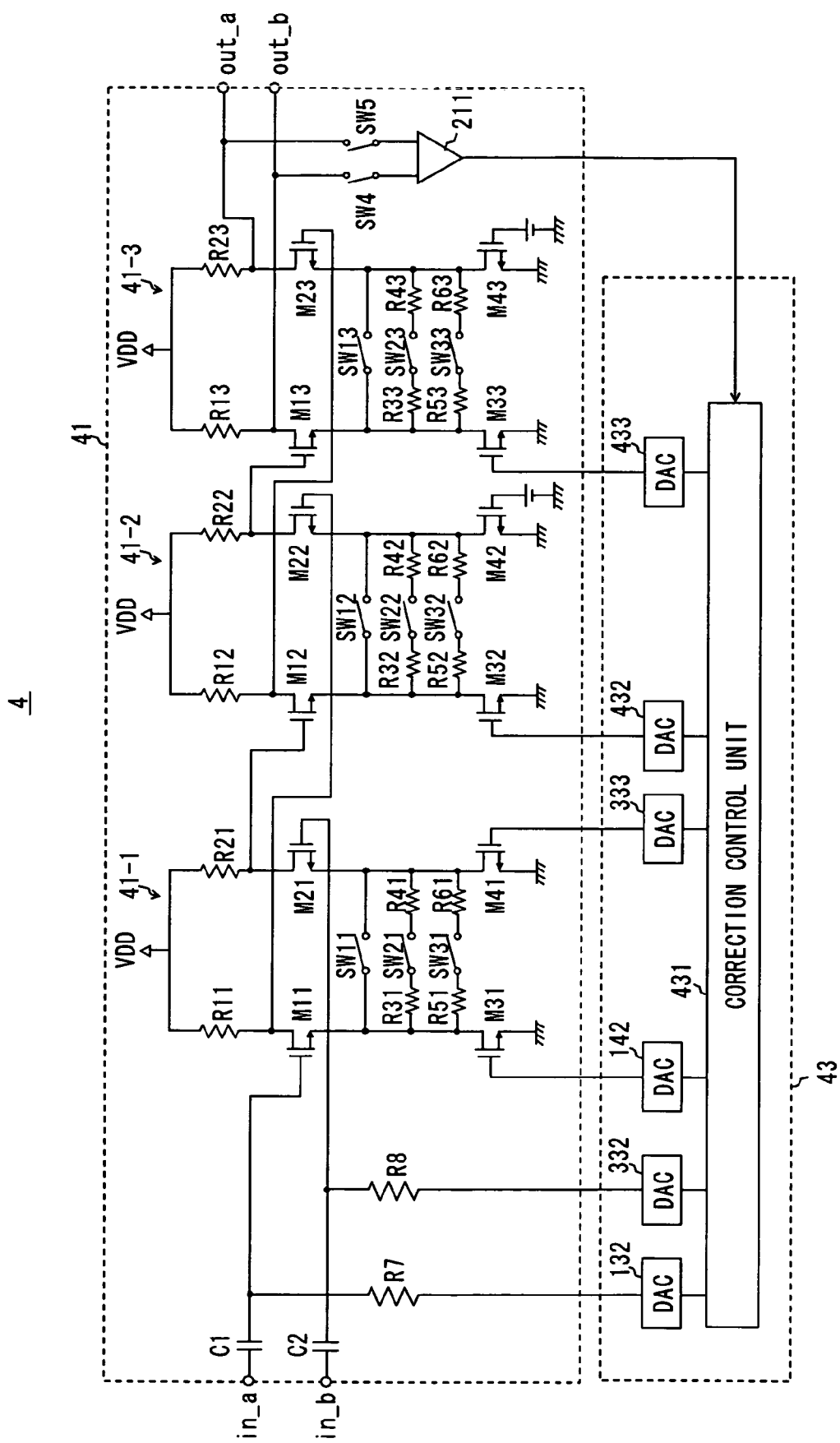
FIG. 11 is a diagram of a variable gain amplifier circuit according to a fourth embodiment of the present invention.

FIG. 11 shows a specific configuration example of the variable gain amplifier circuit 4. In the illustrated example of FIG. 11, the multistage amplifying unit 41 is a 3-stage one including amplifying units 41-1 to 41-3. An offset correction unit 43 corresponds to the input offset correcting unit 13 and the output offset correcting units 14-1 to 14-3. A correction control unit 431 receives a comparison result from the comparator 211 to adjust output signals of the DACs 132 and 142, 332, 333, 432, and 433 similar to the correction control unit 231 of the second embodiment or the correction control unit331 of the third embodiment. Here, the DACs 332 and 333 are fine-adjust DACs as described in the third embodiment.

Fifth Embodiment

Figure 12:
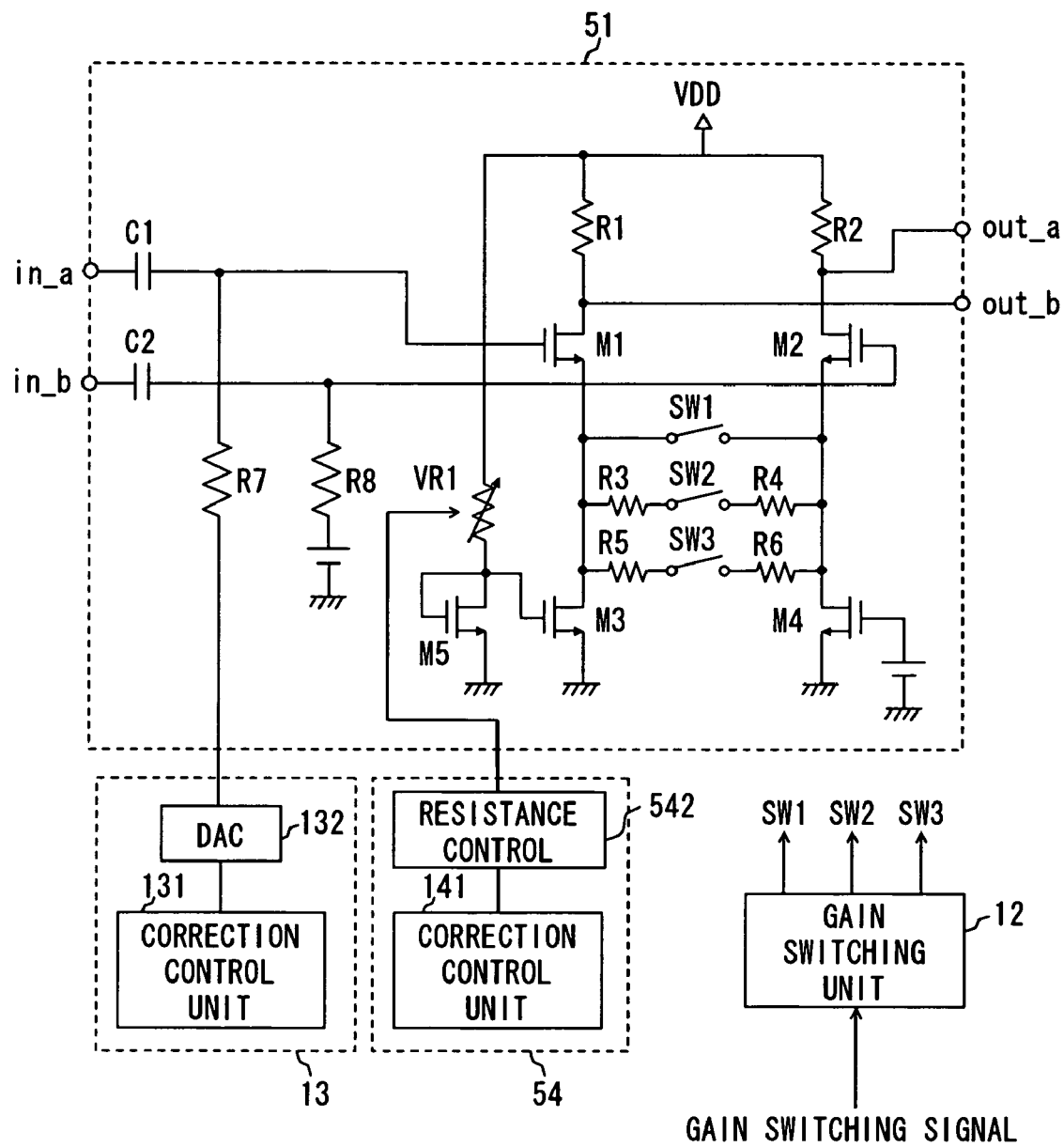
FIG. 12 is a diagram of a variable gain amplifier circuit according to a fifth embodiment of the present invention.

FIG. 12 shows the configuration of a variable gain amplifier circuit 5 according to a fifth embodiment of the present invention. The variable gain amplifier circuit 5 is a modified example of the configuration of the first embodiment as shown in FIG. 3, in which an output signal of the DAC 142 is used to control the gate voltage of the transistor M3. In the variable gain amplifier circuit 5, a resistor control unit 542 controls a resistance value of a variable resistor VR1 to thereby adjust the gate voltage of the transistor M3, a drain current of the transistor M1, and a potential difference between the output terminals out_a and out_b.

Further, the variable resistor VR1 can be replaced by a current source capable of changing a current value in accordance with a control signal from an output offset correcting unit 54. In short, the output offset correction of the present invention aims at attenuating the potential difference Vout_a–Vout_b between the output terminals through adjustment on the output side of the differential pair of transistors M1 and M2. Accordingly, specific measure and configuration for adjusting the potential difference between the output terminals are not limited to the above ones, and may be variously modified.

Sixth Embodiment

In the configuration of the second embodiment as shown in FIG. 5, the configuration of the third embodiment as shown in FIG. 8, and the configuration of the fourth embodiment as shown in FIG. 11, the comparator 211 may function to correct an input offset, and the offset may be corrected based on an input voltage of the comparator 211 to thereby minimize a detection error of the comparator 211. Hence, the correction control units 231, 331 and 431 can precisely determine whether or not the DC offset is converged.

Other Embodiments

Figure 13:
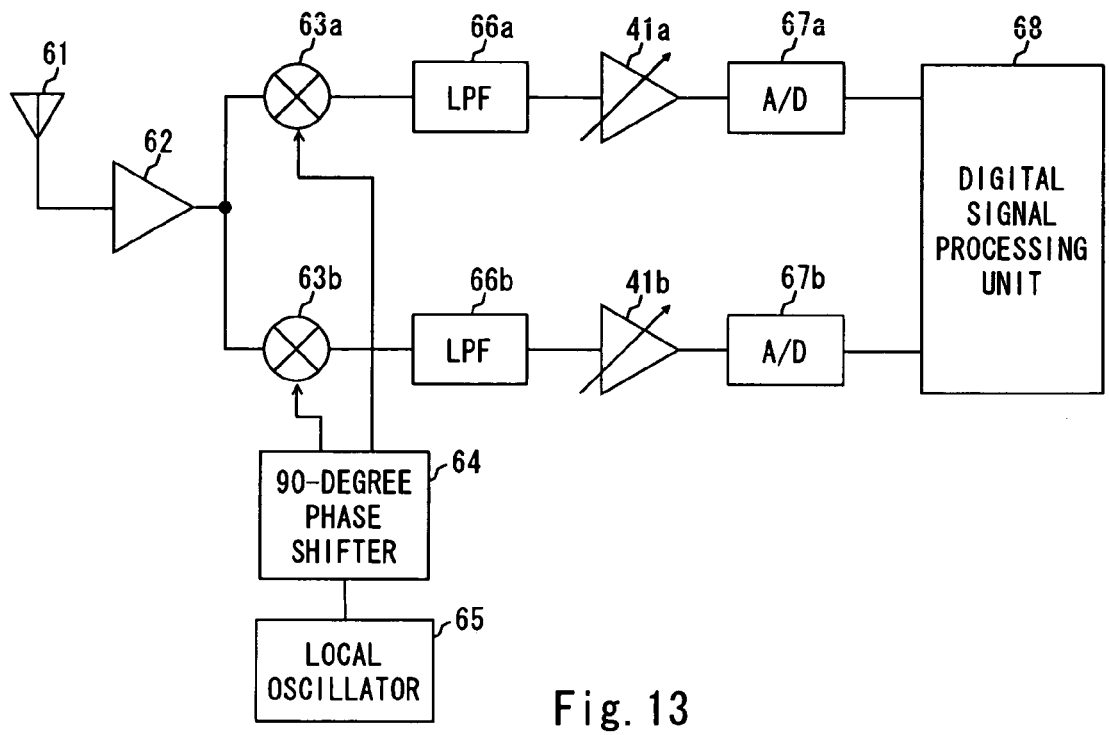
FIG. 13 is a diagram showing a radio communication apparatus according to a sixth embodiment of the present invention.
Figure 14:
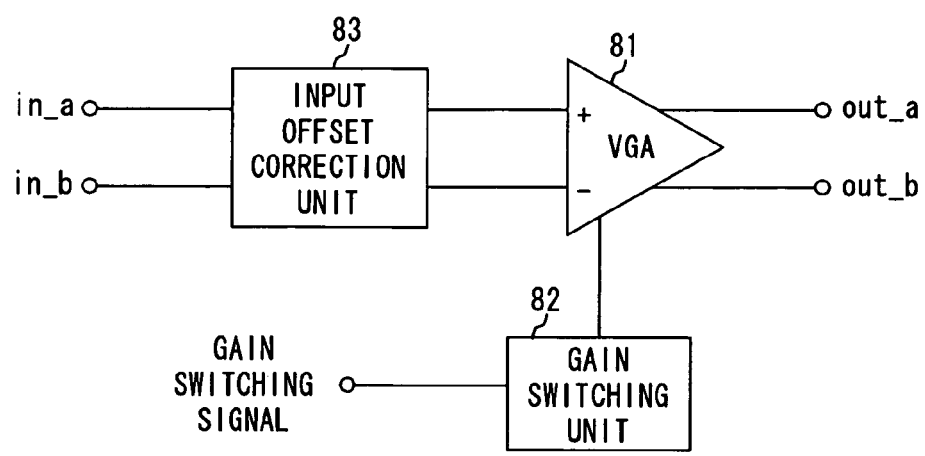
FIG. 14 is a diagram of a conventional variable gain amplifier circuit.

FIG. 13 shows a direct-conversion type radio receiving apparatus 6 including the two variable gain amplifier circuits 41 of the present invention. In the following description, the two variable gain amplifier circuits 41 are referred to as variable gain amplifier circuits 41a and 41b. An RF signal received via an antenna 61 is amplified with a low-noise amplifier 62. The amplified RF signal is branched into two that are mixed with carriers having the same frequency as the RF signal output from a local oscillator 65 at mixers 63a and 63b. The local oscillator 65 is connected with the mixers 63a and 63b through a 90-degree phase shifter 64, and the RF signal is converted into baseband signals that are orthogonal to each other. The baseband signals are amplified up to a predetermined signal level by the variable gain amplifier circuit 41a and 41b after passing through the low-pass filter 66a and 66b. The amplified baseband signals are converted into digital signals by A/D converters 67a and 67b and input to a digital signal processing unit 68. Here, the low-pass filters 66a and 66b may be inserted behind the variable gain amplifier circuits 41a and 41b or between circuits in the multistage variable gain amplifier circuits 41a and 41b as well as in front of the variable gain amplifier circuits 41a and 41b.

The gains of the variable gain amplifier circuits 41a and 41b should be changed in accordance with a change in input level of the radio receiving apparatus 6. As set forth above, the variable gain amplifier circuits 41a and 41b does not need to execute DC offset correction again at the time of changing the gain. Consequently, it is possible to change the gain at high speeds and prevent a loss of received data due to a delay in changing the gain.

It is apparent that the present invention is not limited to the above embodiment that may be modified and changed without departing from the scope and spirit of the invention.

What is claimed is:

1. A variable gain amplifier circuit, comprising:
an amplifying unit capable of switching a gain; and
a correction control unit that individually executes correction to attenuate a fixed offset component independent of a change in gain of the amplifying unit out of a DC offset involved in an output voltage of the amplifying unit and correction to attenuate an input offset component that varies depending on the gain of the amplifying unit,
wherein the fixed offset component is corrected while setting the gain of the amplifying unit such that the input offset component is not involved in the output voltage of the amplifying unit.

2. The variable gain amplifier circuit according to claim 1, wherein the correction control unit corrects the input offset component after correcting the fixed offset component.

3. The variable gain amplifier circuit according to claim 2, wherein the amplifying unit is a differential amplifier circuit for outputting a differential output signal of a transistor differential pair, and
the fixed offset component is corrected by controlling a drain current of at least one of two transistors as the differential pair.

4. The variable gain amplifier circuit according to claim 3, wherein the input offset component is corrected by applying a correction voltage to the amplifying unit to attenuate the DC offset.

5. The variable gain amplifier circuit according to claim 2, wherein the amplifying unit is a differential amplifier circuit for outputting a differential output signal of a transistor differential pair, and
the input offset component is corrected by attenuating a DC offset involved in the output voltage of the amplifying unit while connecting source terminals of two transistors as the differential pair.

6. The variable gain amplifier circuit according to claim 2, wherein the amplifying unit is a differential amplifier circuit for outputting a differential output signal of a transistor differential pair,
the variable gain amplifier circuit further comprises:
a comparator circuit for comparing two differential output signals output by the amplifying unit; and
a counter for incrementing/decrementing a count value based on a comparison result from the comparator circuit, and
the correction control unit corrects the fixed offset component and corrects the input offset component based on the count value of the counter.

7. The variable gain amplifier circuit according to claim 6, wherein the correction control unit includes a first D/A converter for converting the count value of the counter into a voltage signal and applying the voltage signal to the amplifying unit.

8. The variable gain amplifier circuit according to claim 6, wherein the amplifying unit includes a current source controlled with voltage, the current source is provided on a source side of one of two transistors as the differential pair, the correction control unit includes a second D/A converter for converting a count value of the counter into a voltage signal and outputting the voltage signal, and the current source is controlled based on the voltage signal output from the second D/A converter.

9. The variable gain amplifier circuit according to claim 4, wherein the amplifying unit is a differential amplifier circuit for outputting a differential output signal of a transistor differential pair, the correction control unit includes:

a first voltage supply unit for outputting a correction voltage signal added to a first input signal for the amplifying unit; and a second voltage supply unit that outputs a voltage signal for biasing a second input signal in opposite phase to the first input signal and can change an output voltage with smaller adjustment step size than a adjustment step size of the first voltage supply unit, and the correction control unit corrects an input offset with the second voltage supply unit after correcting an input offset with the first voltage supply unit.

10. The variable gain amplifier circuit according to claim 4, wherein the amplifying unit is a differential amplifier circuit for outputting a differential output signal of a transistor differential pair, and includes two current sources controlled with voltage, the current sources provided on a source side of each of two transistors as the differential pair, and the correction control unit includes a voltage supply unit for individually supplying control voltages to the current sources.

11. The variable gain amplifier circuit according to claim 1, wherein the amplifying unit is a multistage amplifier circuit in which two or more differential amplifier circuits are connected in series, and voltages input to a first differential amplifier circuit of the amplifying unit are sequentially amplified and output from a final differential amplifier circuit of the amplifying unit, and the correction control unit staffs correction of a fixed offset component from the final differential amplifier circuit, and executes offset correction of the differential amplifier circuits in the order from a subsequent stage side of the amplifying unit.

12. The variable gain amplifier circuit according to claim 11, wherein the correction control unit collectively executes correction of an input offset component of each of the differential amplifier circuits in the order from the final differential amplifier circuit to a second differential amplifier circuit of the amplifying unit, and correction of a fixed offset component of a previous differential amplifier circuit.

13. The variable gain amplifier circuit according to claim 4, further comprising:

a voltage source for applying the correction voltage to the amplifying unit;

a resistor;

a first path for connecting the voltage source and the amplifying unit through the resistor; and a second path for connecting the voltage source and the amplifying unit by bypassing the resistor.

14. The variable gain amplifier circuit according to claim 2, wherein the amplifying unit is a differential amplifier circuit for outputting a differential output signal of a transistor differential pair, the variable gain amplifier circuit further comprises:

a first transistor connected to a source terminal of one of two transistors as the differential pair, a second transistor connected to the source terminal in parallel to the first transistor, and a gate width of the second transistor is smaller than a gate width of the first transistor, and the correction control unit adjusts a gate voltage of the second transistor to control a drain current of the one of two transistors as the differential pair.

15. The variable gain amplifier circuit according to claim 2, wherein the amplifying unit is a differential amplifier circuit for outputting a differential output signal of a transistor differential pair, the variable gain amplifier circuit farther comprises:

a first transistor connected to a source terminal of one of two transistors as the differential pair, a second transistor connected to a drain terminal of the one of two transistors as the differential pair, and a gate width of the second transistor is smaller than a gate width of the first transistor, and the correction control unit adjusts a gate voltage of the second transistor to control a drain current of the one of two transistors as the differential pair.

16. The variable gain amplifier circuit according to claim 2, wherein the amplifying unit is a differential amplifier circuit for outputting a differential output signal of a transistor differential pair, the variable gain amplifier circuit further comprises:

a first transistor connected to a source terminal of one of two transistors as the differential pair, a second transistor connected to the source terminal in parallel to the first transistor with gate connecting to its drain terminal, and a variable resistor connected to a gate terminal of the first transistor, the variable resistor adjusting a gate voltage of the first transistor, and the correction control unit adjusts a resistance value of the variable resistor to control a drain current of the one of two transistors as the differential pair.

17. A DC offset correcting method for attenuating a DC offset involved in an output voltage of a differential amplifier circuit capable of switching a gain, comprising:

executing correction to attenuate a fixed offset component independent of a change in gain of the differential amplifier circuit out of the DC offset; and executing correction to attenuate an input offset component that varies depending on the change in gain of the differential amplifier circuit, wherein the fixed offset component is corrected while setting the gain of the differential amplifier circuit such that the input offset component is not involved in the output voltage of the differential amplifier circuit.

18. The DC offset correcting method according to claim 17, wherein the fixed offset component is corrected by controlling a drain current of at least one of two transistors as an differential pair in the differential amplifier circuit.

19. The DC offset correcting method according to claim 17, wherein the input offset component is corrected by adding a correction voltage to an input bias voltage of the differential amplifier circuit.

20. The DC offset correcting method according to claim 17, wherein the input offset component is corrected by adding a first correction voltage to a first input bias voltage of the differential amplifier circuit and then adding to a second input bias voltage in opposite phase to the first input bias voltage, the second correction voltage that can be adjusted with smaller adjustment step size than a adjustment step size for the first correction voltage signal.

21. The DC offset correcting method according to claim 17, wherein the differential amplifier circuit includes two current sources controlled with voltage, the current sources provided on a source side of each of two transistors as the differential pair, and the correction for attenuating the fixed offset component is executed by changing amounts of current supplied from one or both of the current sources.

22. The DC offset correcting method according to claim 17, wherein the differential amplifier circuit is a multistage amplifier circuit in which two or more differential amplifier circuits are connected in series, and voltages input to a first differential amplifier circuit are sequentially amplified and output from a final differential amplifier circuit, the correction for attenuating the fixed offset component independent of gains of all the differential amplifier circuits out of the DC offset is executed, and the correction for attenuating the input offset component that varies depending on the gain of the differential amplifier circuits is executed in the order from the final differential amplifier circuit to the first differential amplifier circuit, after the correction of the fixed offset component.

23. The DC offset correcting method according to claim 22, wherein the correction of the input offset component of each of the differential amplifier circuits in the order from the final differential amplifier circuit to a second differential amplifier circuit of the multistage amplifier circuit and the correction of the fixed offset component of a previous differential amplifier circuit are collectively executed.

24. The DC offset correcting method according to claim 22, wherein the correction of the input offset component of each of the differential amplifier circuits constituting the multistage amplifier circuit is executed by adding a correction voltage to an input bias voltage of each of the differential amplifier circuits to attenuate the DC offset of an output voltage of the final differential amplifier circuit.

25. A radio receiving apparatus, comprising:

a receiving unit for receiving a radio signal and outputting a baseband signal;

a variable gain amplifier circuit for amplifying the baseband signal output from the receiving unit;

an A/D converter for converging the baseband signal amplified with the variable gain amplifier circuit into a digital signal; and a digital signal processing circuit for processing the digital signal, the variable gain amplifier circuit comprising a correction control unit for independently executing correction to attenuate a fixed offset component independent of a gain change of the variable gain amplifier circuit out of a DC offset involved in an output signal of the variable gain amplifier circuit, and executing correction to attenuate an input offset component that varies depending on the gain of the amplifying unit, wherein the fixed offset component is corrected while setting the gain of the amplifying unit such that the input offset component is not involved in the output voltage of the amplifying unit.

26. The radio receiving apparatus according to claim 25, wherein the correction control unit corrects the input offset component after correcting the fixed offset component.

27. A DC offset correcting method for attenuating a DC offset involved in an output voltage of a differential amplifier circuit capable of switching a gain, comprising:

calculating a fixed offset component VOS_fix independent of a gain change of the differential amplifier circuit and an input offset component VOS_in that varies depending on a gain of the differential amplifier circuit based on output offsets VOS(A1) and VOS(A2) provided that VOS(A1) and VOS(A2) represent an output offset for a first gain A1 of the differential amplifier circuit and an output offset for a second gain A2 of the differential amplifier circuit; and executing correction to attenuate the fixed offset component VOS_fix and the input offset component VOS_in, wherein the fixed offset component VOS_fix and the input offset component VOS_in are derived from two expressions:

$$VOS(A1) = VOS\_in * A1 + VOS\_fix$$

$$VOS(A2) = VOS\_in * A2 + VOS\_fix.$$

* * * * *